United States Patent
Ni et al.

(10) Patent No.: US 10,559,260 B2
(45) Date of Patent: Feb. 11, 2020

(54) ORGANIC LIGHT EMITTING DIODE DISPLAY AND MOBILE TERMINAL

(71) Applicant: EverDisplay Optronics (Shanghai) Limited, Shanghai (CN)

(72) Inventors: Jie Ni, Shanghai (CN); Nana Xiong, Shanghai (CN)

(73) Assignee: EVERDISPLAY OPTRONICS (SHANGHAI) LIMITED, Shanghai (CN)

( * ) Notice: Subject to any disclaimer, the term of this patent is extended or adjusted under 35 U.S.C. 154(b) by 35 days.

(21) Appl. No.: 15/903,599

(22) Filed: Feb. 23, 2018

(65) Prior Publication Data

US 2018/0247593 A1    Aug. 30, 2018

(30) Foreign Application Priority Data

Feb. 24, 2017  (CN) ............................ 2017 1 0103971

(51) Int. Cl.
  *G09G 3/30*   (2006.01)
  *G09G 3/3258*  (2016.01)
  *H01L 27/32*   (2006.01)

(52) U.S. Cl.
  CPC ......... *G09G 3/3258* (2013.01); *H01L 27/326* (2013.01); *H01L 27/3276* (2013.01); *G09G 2320/0233* (2013.01); *H01L 2227/32* (2013.01)

(58) Field of Classification Search
  CPC .................... G09G 2320/0233; H01L 27/3276

USPC ...................................................... 345/76–80
See application file for complete search history.

(56) References Cited

U.S. PATENT DOCUMENTS

| | | | |
|---|---|---|---|
| 2006/0077144 A1* | 4/2006 | Eom | G09G 3/32 345/82 |
| 2013/0016086 A1* | 1/2013 | Ebisuno | G09G 3/3225 345/212 |
| 2014/0085582 A1 | 3/2014 | Chang et al. | |
| 2017/0154946 A1* | 6/2017 | Ono | G09G 3/3258 |

FOREIGN PATENT DOCUMENTS

| | | |
|---|---|---|
| CN | 1825421 | 8/2006 |
| CN | 103839520 | 6/2014 |

* cited by examiner

*Primary Examiner* — Roy P Rabindranath
(74) *Attorney, Agent, or Firm* — Andrew F. Young, Esq.; Lackenbach Siegel, LLP

(57) ABSTRACT

The present invention relates to an organic light emitting diode display capable of suppressing voltage distribution inhomogeneity on a display panel so as to realize a brightness homogeneity of a display screen. The organic light emitting diode display comprises a substrate, an active region disposed on the substrate, and an annular wiring similarly formed on the substrate and surrounding the periphery of the active region to form a closed pattern, the supply voltage supplied to the active region is applied to the annular wiring.

7 Claims, 2 Drawing Sheets

ORGANIC LIGHT EMITTING DIODE DISPLAY AND MOBILE TERMINAL

CROSS-REFERENCE TO RELATED APPLICATIONS

The present application claims priority to and the benefit of Chinese Patent Application No. CN 201710103971.2, filed on Feb. 24, 2017, the entire content of which is incorporated herein by reference.

BACKGROUND OF THE INVENTION

1. Field of the Invention

The invention relates to the field of display, more specifically, to an organic light emitting diode display which can suppress inhomogeneous voltage distribution on a display panel so as to achieve brightness homogeneity of the display screen.

2. Description of the Related Art

In the field of flat panel displays, as the organic light emitting diode devices can emit light without the additional light sources, their viewing angles and contrast are much better than conventional ones such as liquid crystal displays. Organic light emitting diode devices can be driven with lower direct current and have the characteristics of fast response. In order to more precisely define the driving current flowing into the organic light emitting diode, during the process of the pixel circuit design the designer will consider incorporating the light-emitting control unit which controls the driving current, so as to avoid the negative factors that may cause the pixel current to be unstable during the writing of the data to the pixel circuit, so as not to make the sense of flash caused by the ripple current flowing through the light-emitting diode in the pixel circuit. The value of the supply voltage ELVDD in the AMOLED pixel circuit directly affects the value of the current on the OLED device, which in turn affects the brightness and stability of the OLED. With the increasing of the dimension of the display, the voltage drop (IR drop) of the supply voltage ELVDD becomes more and more serious, making the voltage distribution of the ELVDD on the panel become inhomogeneous, thus affecting the brightness homogeneity of the display screen. Reducing the IR drop of the ELVDD is one of the issues we need to solve.

A prior art discloses a pixel circuit and a driving method thereof, a display panel and a display device to improve brightness uniformity. The pixel circuit of the invention includes a control sub-circuit, a compensation sub-circuit, a driving transistor and a light emitting device, wherein the compensating sub-circuit performs a potential reset under the control of the control sub-circuit and serves to store the threshold voltage of the driving transistor, so as to compensate threshold voltage of the driving transistor when driving transistor drives the light emitting device to shine. By implementing the invention, the driving current of the light emitting device is not related to the threshold voltage of the driving transistor, so that the display uniformity of the panel is improved, in which the display characteristic is considered from the threshold voltage.

Another prior art discloses a device for compensating inhomogeneity of the panel region, and a method thereof. A plurality of display areas are defined on the display panel, wherein the display areas each has a panel characteristic data which, when receiving a pixel data, needs to determine the pixel data corresponds to which of the display areas so as to correct the pixel data according to the corresponding panel characteristic data, so that the corrected pixel data can be finally transferred to the designated display panel to improve the display effect. Another prior art discloses a Fringe-Field Switching (FFS) mode liquid crystal display (LCD) panel with optimized designs of pixel areas and/or liquid crystal materials, the panel includes an active element array substrate provided with a plurality of pixel regions, a pair of substrates and a liquid crystal layer, wherein the pixel regions comprise a plurality of first common electrodes, a second common electrode between the other pixel region adjacent to the horizontal direction, and a pixel electrode. By changing the relative position of the electrode lines in the pixel region on the active element array substrate, the liquid crystal layer in the liquid crystal display panel adopts a liquid crystal material characteristic with a predetermined range value, so as to change the transmittance and the light transmission homogeneity at different positions in the pixel region.

The main issue of the prior art is that when the pixel power line is relatively long, the power source of the pixel circuit will produce a large voltage drop (IR drop) resulting in severe gray scale inhomogeneity. In the published literature, it is mainly use an increased circuit to compensate for the threshold voltage and IR drop so as to eliminate the issue of short-range and long-range display inhomogeneity due to the threshold voltage of the transistor and the IR drop, or the different display materials so as to change the display homogeneity. These measures cause a lot of cost due to additional components or expensive materials, and the compensation effect for the brightness homogeneity of the display is also poor. The present invention will describe how to reduce the voltage drop (IR drop) of ELVDD to improve brightness homogeneity.

SUMMARY OF THE INVENTION

In an optional embodiment, the invention provides an organic light emitting diode display, comprising a substrate, an active region disposed on the substrate, and an annular wiring similarly formed on the substrate and surrounding the periphery of the active region, wherein the annular wiring forms a closed pattern along the periphery of the active region.

In the above organic light emitting diode display, wherein a supply voltage supplied to the active region is applied to the annular wiring.

In the above organic light emitting diode display, wherein the annular wiring comprises two first frame wirings arranged along a first direction and two second frame wirings arranged along a second direction, the first direction and the second direction are perpendicular to each other.

In the above organic light emitting diode display, wherein the active region is provided with a plurality of first sub-wirings arranged along the first direction and a plurality of second sub-wirings arranged along the second direction.

In the above organic light emitting diode display, wherein one end of any one of the plurality of first sub-wirings is connected to one of the second frame wirings, and the opposite end thereof is connected to another one of the second frame wirings In the above organic light emitting diode display, wherein one end of any one of the second sub-wirings is connected to one of the first frame wirings, and the opposite end thereof is connected to another one of the first frame wirings.

In the above organic light emitting diode display, wherein any one of the first sub-wirings is interconnected with all of the second sub-wirings, and any one of the second sub-wirings is interconnected with all of the first sub-wirings.

In the above organic light emitting diode display, wherein it further comprises a pixel array provided in the active region, and when a supply voltage is applied to the annular wiring, the first wiring and the second wiring are configured to provide the supply voltage to the pixel array.

In an embodiment of the invention, it provides a mobile terminal, comprising: an organic light emitting diode display;

wherein the organic light emitting diode display comprises a substrate, an active region disposed on the substrate, and an annular wiring similarly formed on the substrate and surrounding the periphery of the active region, wherein the annular wiring forms a closed pattern along the periphery of the active region.

In the above mobile terminal, wherein a supply voltage supplied to the active region is applied to the annular wiring.

In the above mobile terminal, wherein it further comprises a plurality of first sub-wirings and a plurality of second sub-wirings provided in the active region, the first sub-wirings and the second sub-wirings are perpendicular to each other, and both ends of the first sub-wirings and both ends of the second sub-wirings are connected to the annular wiring.

In the above mobile terminal, wherein it further comprises a pixel array configured in the active region, the first sub-wirings and the second sub-wirings are configured to provide the supply voltage to the pixel array.

BRIEF DESCRIPTIONS OF THE DRAWINGS

The accompanying drawings, together with the specification, illustrate exemplary embodiments of the present disclosure, and, together with the description, serve to explain the principles of the present invention.

DETAILED DESCRIPTION

Figure 1:
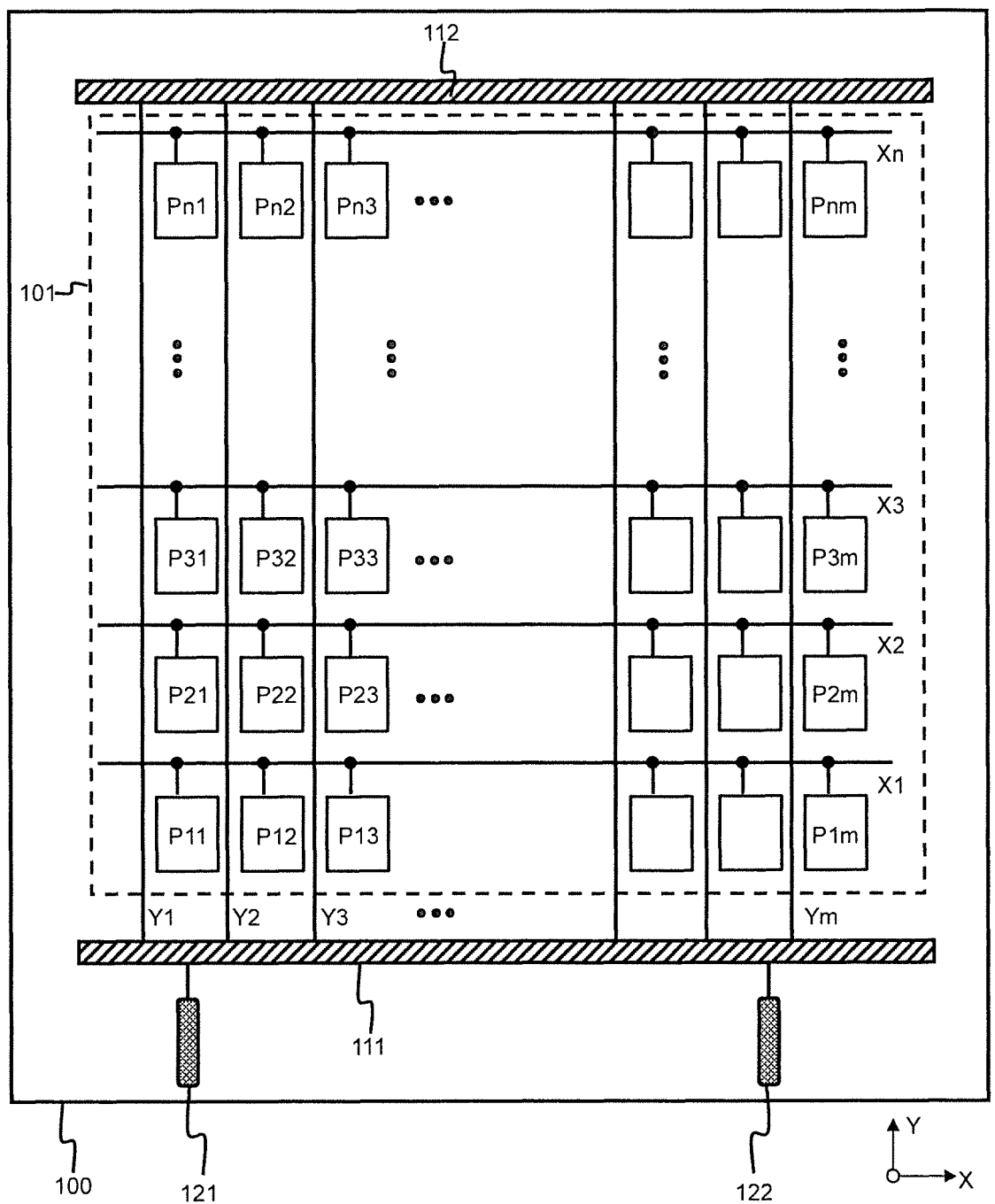
FIG. 1 is the basic architecture of the pixel array of active regions.

The present invention will now be described more fully hereinafter with reference to the accompanying drawings, in which exemplary embodiments of the invention are shown. This invention may, however, be embodied in many different forms and should not be construed as limited to the embodiments set forth herein. Rather, these embodiments are provided so that this disclosure will be thorough and complete, and will fully convey the scope of the invention to those skilled in the art. Like reference numerals refer to like elements throughout.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" and/or "comprising," or "includes" and/or "including" or "has" and/or "having" when used herein, specify the presence of stated features, regions, integers, steps, operations, elements, and/or components, but do not preclude the presence or addition of one or more other features, regions, integers, steps, operations, elements, components, and/or groups thereof.

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and the present disclosure, and will not be interpreted in an idealized or overly formal sense unless expressly so defined herein.

As used herein, "around", "about" or "approximately" shall generally mean within 20 percent, preferably within 10 percent, and more preferably within 5 percent of a given value or range. Numerical quantities given herein are approximate, meaning that the term "around", "about" or "approximately" can be inferred if not expressly stated.

As used herein, the term "plurality" means a number greater than one.

Hereinafter, certain exemplary embodiments according to the present disclosure will be described with reference to the accompanying drawings.

As referred to FIG. 1, a pixel array applied to an active matrix organic light emitting diode AMOLED display screen is arranged on the substrate 100. For example, a pixel array provided in an active region 101 on the substrate 100 includes a first row of pixel circuits P11, P12, P13 . . . P1$m$, and the second row of pixel circuits P21, P22, P23 . . . P2$m$, and so on and so forth, also includes the n$^{th}$ row of pixel circuits Pn1, Pn2, Pn3 . . . Pnm. The above is to divide the entire pixel array in a row manner. In addition, if the entire pixel array is divided in a column manner, the pixel array includes the first column of pixel circuits P11, P21, P31 . . . Pn1, and the second column of pixel circuits P12, P22, P32 . . . Pn2, and so on so forth, also includes the m$^{th}$ column of pixel circuits P1$m$, P2$m$, P3$m$ . . . Pnm. Note that both M and N are natural numbers greater than 1. In addition, a plurality of power lines interleaved in the active area 101 are configured to provide operating voltage for each pixel circuit. For example, a lateral wiring X1 is connected to each of the first row of pixel circuits P11, P12, P13 . . . P1$m$, and provides them with operating voltage, and another lateral wiring X2 is connected to each of the second row of pixel circuits P21, P22, P23, . . . P2$m$, and provides them with operating voltage. So on and so forth, a lateral wiring Xn is connected to each pixel circuit of the n$^{th}$ row of pixel circuits Pn1, Pn2, Pn3 . . . Pnm, and provides them with operating voltage. The lateral wirings X1, X2, X3, . . . Xn defined on the X axis in the Cartesian coordinate system are respectively connected to a plurality of longitudinal wirings Y1, Y2, Y3, . . . Ym defined on the Y axis. In order to avoid the various interpretations of understanding caused by the observation angle of view, it also pre-defined that the length direction of the wirings X1, X2, X3, . . . Xn can also be defined as a first direction, and length direction of the wirings Y1, Y2, Y3, . . . Ym can also be defined as a second direction, the first direction and the second direction are perpendicular to each other.

In order to supply the operating voltage to the pixel circuit, a number of the power supply input terminals 121 and 122, near the frame wiring 111, are arranged on the non-active region of the substrate 100, and the wirings Y1, Y2, Y3, . . . Ym are connected to the frame wirings 111 and 112 at the edge of the active area 101. The power supply input terminals 121 and 122 are at least connected to the frame wiring 111. When the stable supply voltage ELVDD is input to the power supply input terminals 121 and 122, the supply voltage ELVDD is applied to each of the wirings Y1, Y2, Y3 . . . Ym. Considering the wirings X1, X2, X3, . . . Xn and the wirings Y1, Y2, Y3, . . . Ym are interconnected, the wiring X1, X2, X3, . . . Xn also provide the supply voltage ELVDD to each of the pixel circuits. A tricky problem is that when the power supply wiring is long, the power supply of the pixel circuit will produce a large voltage drop (IR drop), resulting in serious gray scale inhomogeneity, this is because the power supply wiring itself has a parasitic resistance. The parasitic resistance will also produce a voltage drop. The larger the dimension of the display is, the longer the power supply wiring is, resulting in inhomogeneous brightness being more obvious.

Figure 2:
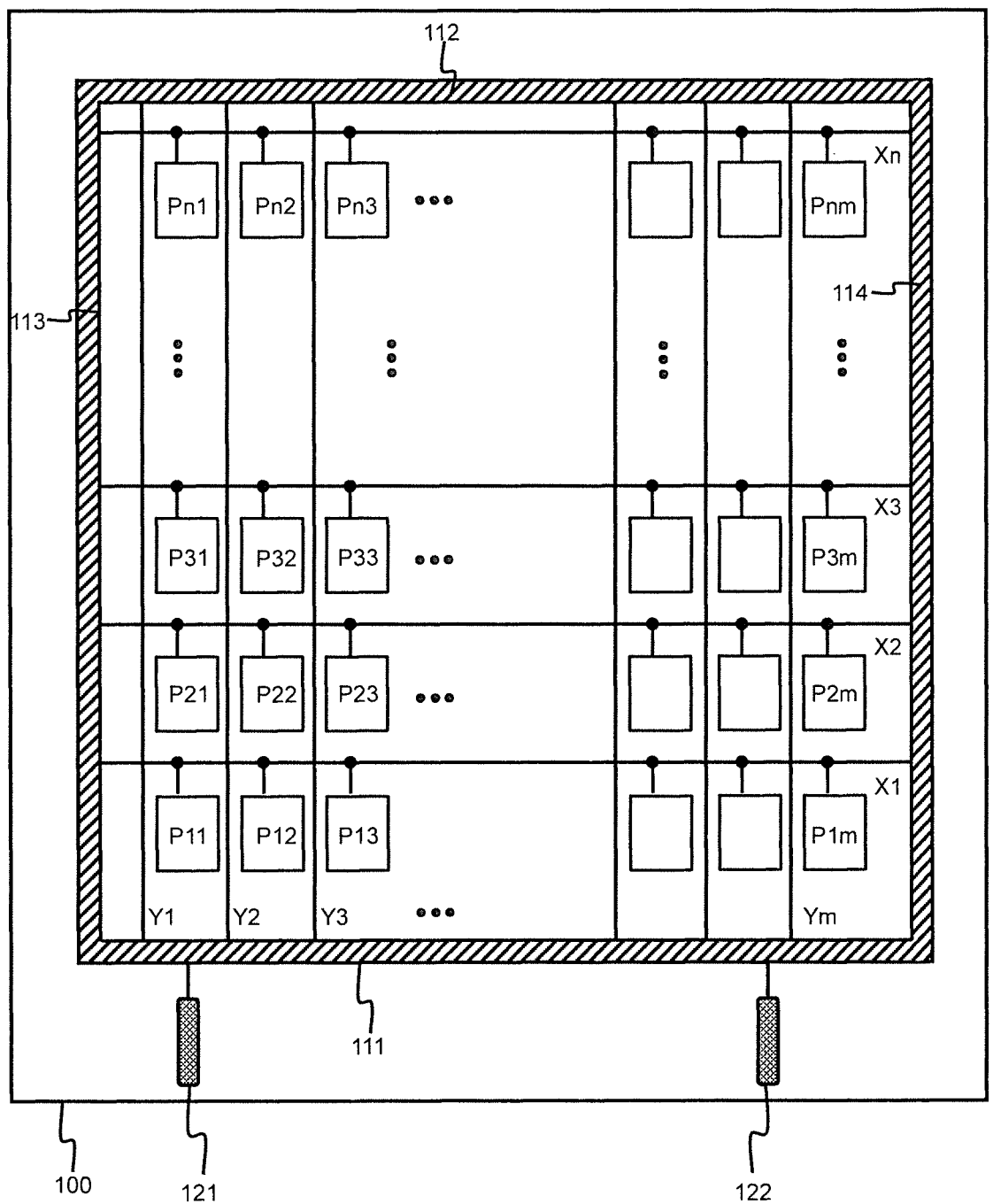
FIG. 2 is a schematic view of an annular wiring designed around the periphery of the active regions.

As referred to FIG. 2, in order to avoid the brightness inhomogeneity of the display screen, an annular wiring having a closed pattern is provided at the peripheral edge of the active region 101 on the substrate 100. The annular wiring includes two first frame wirings 111 and 112 arranged along a first direction (e.g., an X axis direction), and two second frame wirings 113 and 114 arranged along a second direction (e.g., Y axis direction), wherein the annular wiring is a square frame structure in which the first frame wirings 111 and 112 constitute a set of opposite sides and the second frame wirings 113 and 114 constitute the other set of opposite sides. A closed annular wiring is constructed by the first frame wiring 111, the second frame wiring 114, the first frame wiring 112, and the second frame wiring 113, so that when the supply voltage ELVDD is applied to any one of the frame wirings, the entire annular wiring is substantially at the electric potential of the supply voltage ELVDD. For example, when the stable supply voltage ELVDD is input to the power supply input terminals 121 and 122, since the power supply terminals 121 and 122 are connected to the first frame wiring 111, the entire annular wiring is substantially at the potential of the supply voltage ELVDD.

In the embodiment of FIG. 2, each of the wirings X1, X2, X3, . . . Xn arranged side by side intersects with the second frame wirings 113 and 114, and one end of each of the wirings is extended to the edge of the active region 101 and is connected to the second frame wiring 113, the opposite end of each of the wirings is extended to the edge of the active region 101 and is connected to the second frame wiring 114. In addition, each of the wirings Y1, Y2, Y3, . . . , Ym arranged side by side intersects with the first frame wirings 111 and 112, and one end of each of the wirings is extended to the edge of the active region 101 and is connected to the first frame wiring 111, the opposite end of each of the wirings is extended to the edge of the active region 101 and is connected to the first frame wiring 112. That is, when the entire annular wiring is substantially at the electric potential of the supply voltage ELVDD, both ends of each of the wirings X1, X2, X3, . . . Xn are substantially at the electric potentials of the supply voltage ELVDD, so that, due to the introduced annular wiring, the voltage drop shared by the parasitic resistance of each of lateral wirings X1, X2, X3, . . . Xn is forced to be approximately zero, and the voltage drop shared by the parasitic resistance of each of the longitudinal wirings Y1, Y2, Y3, . . . , Ym is forced to be approximately zero. Among the first row of pixel circuits P11, P12, P13 . . . P1m, the second row of pixel circuits P21, P22, P23 P2m till the n$^{th}$ row of pixel circuits Pn1, Pn2, Pn3 . . . Pnm, all the operating voltages of pixel circuits between different lines are the supply voltage ELVDD. In the same way, among the first column of pixel circuits P11, P21, P31 . . . Pn1, the second column of pixel circuits P12, P22, P32 . . . Pn2 till the m$^{th}$ column of pixel circuits P1m, P2m, P3m . . . Pnm, all the operating voltages of pixel circuits between different column are the supply voltage ELVDD. In other words, the voltage drop of the ELVDD over different wirings is reduced, so that a very homogeneous voltage distribution is applied across the panel, thus the brightness homogeneity of the entire screen of the display is optimized.

As referred to FIG. 2, any one of the lateral wirings X1, X2, X3, . . . , Xn is also interconnected with all the longitudinal wirings Y1, Y2, Y3, . . . , Ym, and at the same time, any one of the longitudinal wirings Y1, Y2, Y3, . . . , Ym is interconnected with all the lateral wirings X1, X2, X3, . . . , Xn, thus the equipotential relationship on each wiring is further strengthened, so that the voltage distribution on the entire panel applied by the ELVDD becomes more homogeneous. It can be seen that by the measures of the present invention, even if the dimension of the display is increased, the voltage of the supply voltage ELVDD is not dropped, so that the display brightness between the sub-pixel circuits in the entire pixel array is exactly the same. The foregoing is only the preferred embodiments of the invention, not thus limiting embodiments and scope of the invention, those skilled in the art should be able to realize that the schemes obtained from the content of specification and figures of the invention are within the scope of the invention.

What is claimed is:

1. An organic light emitting diode display, comprising:
a substrate;
an active region disposed on the substrate; and
an annular wiring similarly formed on the substrate and surrounding a periphery of the active region;
wherein the annular wiring forms a closed pattern along the periphery of the active region;
the annular wiring comprises two first frame wirings arranged along a first direction and two second frame wirings arranged along a second direction, and the first direction and the second direction are perpendicular to each other;
the active region is provided with a plurality of first sub-wirings arranged along the first direction and a plurality of second sub-wirings arranged along the second direction;
wherein any one of the first sub-wirings is interconnected with all of the second sub-wirings, and any one of the second sub-wirings is interconnected with all of the first sub-wirings.

2. The organic light emitting diode display according to claim 1, wherein a supply voltage supplied to the active region is applied to the annular wiring.

3. The organic light emitting diode display according to claim 1,
wherein one end of any one of the plurality of first sub-wirings is connected to one of the second frame wirings, and the opposite end thereof is connected to another one of the second frame wirings.

4. The organic light emitting diode display according to claim 1,
wherein one end of any one of the second sub-wirings is connected to one of the first frame wirings, and the opposite end thereof is connected to another one of the first frame wirings.

5. The organic light emitting diode display according to any one of claims 3 to 4, further comprising a pixel array provided in the active region, and when a supply voltage is applied to the annular wiring, the first frame wiring and the second frame wiring being configured to provide the supply voltage to the pixel array.

6. A mobile terminal, comprising: an organic light emitting diode display;
- wherein the organic light emitting diode display comprises a substrate, an active region disposed on the substrate, and an annular wiring similarly formed on the substrate and surrounding a periphery of the active region, wherein the annular wiring forms a closed pattern along the periphery of the active region, a supply voltage supplied to the active region is applied to the annular wiring;
- further comprising a plurality of first sub-wirings and a plurality of second sub-wirings provided in the active region, the first sub-wirings and the second sub-wirings being perpendicular to each other, and both ends of the first sub-wirings and both ends of the second sub-wirings being connected to the annular wiring.

7. The mobile terminal according to claim 6, further comprising a pixel array configured in the active region, the first sub-wirings and the second sub-wirings being configured to provide the supply voltage to the pixel array.

* * * * *